(12) United States Patent
Treiblmayr

(10) Patent No.: US 9,498,918 B2
(45) Date of Patent: Nov. 22, 2016

(54) METHOD AND DEVICE FOR EMBOSSING

(71) Applicant: EV GROUP E. THALLNER GMBH, St. Florian am Inn (AT)

(72) Inventor: Dominik Treiblmayr, Kirchdorf am Inn (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 14/427,168

(22) PCT Filed: Sep. 18, 2012

(86) PCT No.: PCT/EP2012/068355
§ 371 (c)(1),
(2) Date: Mar. 10, 2015

(87) PCT Pub. No.: WO2014/044295
PCT Pub. Date: Mar. 27, 2014

(65) Prior Publication Data
US 2015/0224705 A1 Aug. 13, 2015

(51) Int. Cl.
| | |
|---|---|
| *B05D 3/00* | (2006.01) |
| *C08J 7/18* | (2006.01) |
| *G21H 5/00* | (2006.01) |
| *B29C 59/02* | (2006.01) |
| *G03F 7/00* | (2006.01) |
| *B82Y 10/00* | (2011.01) |
| *B82Y 40/00* | (2011.01) |
| *B29C 71/04* | (2006.01) |
| *B29L 9/00* | (2006.01) |

(52) U.S. Cl.
CPC .............. *B29C 59/026* (2013.01); *B29C 71/04* (2013.01); *B82Y 10/00* (2013.01); *B82Y 40/00* (2013.01); *G03F 7/0002* (2013.01); *B29L 2009/005* (2013.01)

(58) Field of Classification Search
CPC ............................ B29C 59/026; B29C 71/04
USPC ......... 427/595, 555, 557, 559; 264/402, 403
See application file for complete search history.

(56) References Cited

U.S. PATENT DOCUMENTS

| | | | |
|---|---|---|---|
| 5,254,197 A | 10/1993 | Klems | ......................... 156/272.2 |
| 2004/0149367 A1 | 8/2004 | Olsson et al. | ................... 156/64 |

(Continued)

FOREIGN PATENT DOCUMENTS

| | | |
|---|---|---|
| DE | 102008029058 A1 | 12/2009 |
| WO | WO 01/63361 A1 | 8/2001 |
| WO | WO 2004/114017 A1 | 12/2004 |
| WO | WO 2009/137049 A1 | 11/2009 |

OTHER PUBLICATIONS

International Search Report from corresponding International Patent Application No. PCT/EP2012/068355, dated Jan. 8, 2013 (English-language translation provided).

*Primary Examiner* — Michael Wieczorek
(74) *Attorney, Agent, or Firm* — Kusner & Jaffe

(57) ABSTRACT

A process for embossing a structure in an embossing material that is applied on a substrate comprising the steps of embossing the embossing material by an embossing die and hardening the embossing material, wherein at least the substrate and/or the embossing die and/or at least one heating layer arranged between the substrate and the embossing material and/or between the embossing die and the embossing material are irradiated by means of microwaves for hardening the embossing material.

15 Claims, 1 Drawing Sheet

(56) References Cited

U.S. PATENT DOCUMENTS

| | | | |
|---|---|---|---|
| 2006/0027949 A1 | 2/2006 | Wang et al. | 264/322 |
| 2006/0289113 A1* | 12/2006 | Cura | C09J 5/06 156/272.4 |
| 2007/0251940 A1 | 11/2007 | Hennessey | 219/635 |
| 2010/0009137 A1 | 1/2010 | Kodama | 428/195.1 |
| 2012/0133084 A1* | 5/2012 | Ortner | H01L 21/02 264/447 |

* cited by examiner

METHOD AND DEVICE FOR EMBOSSING

FIELD OF THE INVENTION

This invention relates to a process for embossing a structure in an embossing material applied on a substrate.

BACKGROUND OF THE INVENTION

In many branches of industry, but with the semiconductor industry leading the way, embossing (imprinting) technologies are important in order to produce microstructures and/or nanostructures at low expense, low costs and short processing times.

Known imprinting technologies are processes in which a die is pressed by force into an embossing material in order to produce a negative of the die. The embossing material can then be hardened after the embossing process by different chemical and/or physical processes, so that the embossing material correspondingly hardens and is dimensionally stable after the die is removed.

The hardening is done, for example, by irradiation with UV light, by heating by means of heating elements, by electrical and/or magnetic fields, by chemical reaction with a reagent, etc.

During thermal hardening, the heating and cooling are carried out, repeatedly in a chamber, which results in high costs because of stringent energy and time requirements.

An advantage of this invention is a process and a device with which a quick, efficient and economical embossing of a thermally-hardenable embossing material is made possible.

This advantage is achieved with the features of the claims. Advantageous further developments of the invention are indicated in the subclaims. Also, all combinations of at least two of the features indicated in the description, the claims and/or the figures fall within the scope of the invention. In the indicated ranges of values, values as boundary values that lie within the above-mentioned limits are also to be considered as disclosed and can be claimed in any combination.

SUMMARY OF THE INVENTION

The invention is based on the concept of irradiating the substrate holding the embossing material and/or a die and/or a heating layer arranged between the substrate and the embossing material and/or between the die and the embossing material with microwaves to harden the thermally-hardenable embossing material. The substrate and/or the die and/or the heating layers are selected in such a way that the latter can be heated by microwaves. By the irradiation with microwaves, a targeted (indirect) heating of the especially thermally-hardenable embossing material is provided, so that efficient control of the hardening process and the specified heating temperatures and/or heating processes is made possible. In particular, it is conceivable to provide temperature sensors on the substrate and/or the die and/or the heating layer, preferably on the side facing away from the embossing material, in order to make possible the control of the microwave irradiation based on the actual measured temperature.

Thermal hardenability is defined as the capacity of materials, after a heat treatment, to occupy a dimensionally stable state. These materials primarily, but not exclusively, include the material groups thermoplasts and duroplasts.

As additional aspects of this invention, separating means are provided for the separation/demolding of the embossing die from the hardened embossing material. This is carried out in particular in a separate process step and/or a preferably physically separated device module.

Hereinafter, substrate means any element on which an embossing material is applied. The substrate can be a die that is covered with the embossing material.

In an advantageous embodiment of the invention, the microwaves that are used for irradiation are electromagnetic waves with a frequency of between 0.01 GHz and 100 GHz, in particular between 0.1 GHz and 50 GHz, preferably between 1 GHz and 10 GHz, and even more preferably between 2 GHz and 5 GHz. Most preferred is a frequency of 2.45 GHz, so that existing microwave devices can be used for the irradiation.

According to another aspect of the invention, a molecular dipolar compound, in particular deionized water, is used as a heating layer. As a molecular dipolar compound, solids and/or liquids, in particular organic substances, are suitable. The molecular dipolar compounds are applied on the substrate, by condensation of moisture present in the atmosphere on the surface of the substrate. As an alternative, the application of a liquid and/or solid film on the embossing substrate can be carried out by a suitable coating process. In particular, the use of a spin-coating unit is provided, on which the thickness of the liquid and/or solid film can be reduced, preferably by a centrifuging process, to a few monolayers. In particular, a layer thickness for the molecular dipolar compound of less than 10 monolayers, preferably less than 5 monolayers, and even more preferably less than 3 monolayers, is provided. According to the invention, the thickness of the molecular dipolar compound is in particular less than 1 mm, preferably less than 100 µm, more preferably less than 10 µm, most preferably less than 1 µm, and with utmost preference less than 0.1 µm.

By the substrate having a molar heat capacity of between 0.001 J/gK and 100 J/gK, more preferably between 0.01 J/gK and 10 J/gK, even more preferably between 0.1 J/gK and 1 J/gK, and most preferably between 0.7 and 0.8 J/gK, the hardening can be controlled more efficiently without resulting in local overheating. Heat capacities at constant pressure or constant volume can be determined with corresponding calorimeters.

By selecting the proper material, the heat conduction of the substrate is set as high as possible in order to emit the heat into the environment as quickly as possible and thus into the embossing material. The substrate according to the invention preferably has a heat conductivity of between 0.10 W/(m*K) and 3,000 W/(m*K), preferably between 1 W/(m*K) and 1,000 W/(m*K), more preferably between 10 W/(m*K) and 200 W/(m*K), and with utmost preference between 100 W/(m*K) and 155 W/(m*K).

As an independent invention, the use of organic films as a heating layer for hardening the embossing material by means of microwave irradiation is disclosed. In particular, organic films predominantly comprising of bipolar molecules, preferably with a high level of adhesive action on the substrate and/or a lower level of adhesive action on the embossing material, are suitable. For this purpose, the embossing material can be easily removed from the substrate after hardening. The high level of adhesion to the substrate ensures that the heating layer does not separate from the substrate during heat loading by microwave irradiation.

As another independent invention, a doped substrate for embossing a structure in an embossing material applied on the substrate, according to the previously-described process, is disclosed. The doping is selected in such a way that after doping, the substrate is better heated by microwaves of a specific frequency range, i.e., it responds better to the microwaves. All standard doping elements for the corresponding substrates are known to one skilled in the art. By way of example, the doping with phosphorus (P), boron (B), arsenic (As) and antimony (Sb) in silicon can be disclosed.

According to the device, the invention is further developed in which the microwave irradiating means are oriented in such a way that the action of the microwaves is oriented perpendicular to the substrate surface, i.e., the Poynting vector of the microwave rays is normal to the substrate surface.

In further development of the invention, it is advantageously provided that the substrate has a thickness of between 10,000 µm and 0.1 µm preferably between 1,000 µm and 1 µm, and more preferably between 100 µm and 10 µm and/or it has a diameter of more than 1". Preferred diameters in the semiconductor industry are 1", 2", 3", 4", 5", 6", 8", 12" or 18". The invention, however, is not limited to a substrate with a standardized diameter. Because of the small thickness of the substrate, a very quick heating of the substrate with low energy consumption is possible. Because of the comparatively large diameters, a large-surface embossing material can be embossed with a single sequence of the process.

To the extent that process features are described, the latter are also to be regarded as disclosed as device features and vice versa.

BRIEF DESCRIPTION OF THE DRAWINGS

Further features and details of the invention follow from the claims, the following description of the figures, and the figures. The latter show in:

DETAILED DESCRIPTION OF THE PREFERRED EMBODIMENTS

In the figures, the same components/features or the components/features that have the same effect are identified with identical reference numbers.

Figure 1:
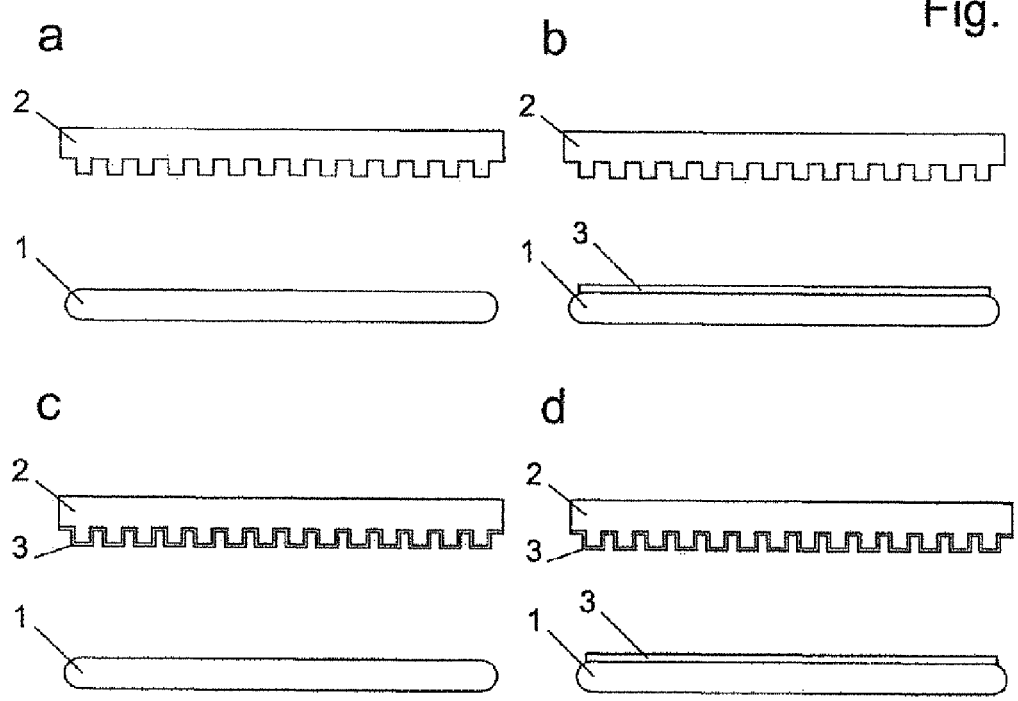
FIG. 1a is a combination of a substrate and a(n) (embossing) die.
FIG. 1b shows a first embodiment, according to the invention, of a substrate with a heating layer and a die.
FIG. 1c shows a second embodiment, according to the invention, of a substrate and a die with a heating layer.
FIG. 1d shows a third embodiment, according to the invention, of a substrate with a heating layer and a die with a heating layer.

In FIG. 1a, a substrate 1 is shown for holding an embossing material 4 for producing a negative 6 of an embossing die 2 that is provided with hardened microstructures and/or nanostructures. By corresponding material selection, the embossing die 2 and/or the substrate 1 is/are used as a heating layer.

In the embodiment shown in FIG. 1b, a heating layer 3 is applied on the surface side of the substrate 1 facing the embossing die 2.

In the embodiment shown in FIG. 1c, the heating layer 3 is applied on a structured embossing side of the embossing die 2. In this configuration, the heating surface, and thus the heat output, is considerably increased.

Another improvement of the heat output is achieved by the heating surfaces 3 from the embodiments according to FIGS. 1b and 1c being combined according to FIG. 1d.

Figure 2:
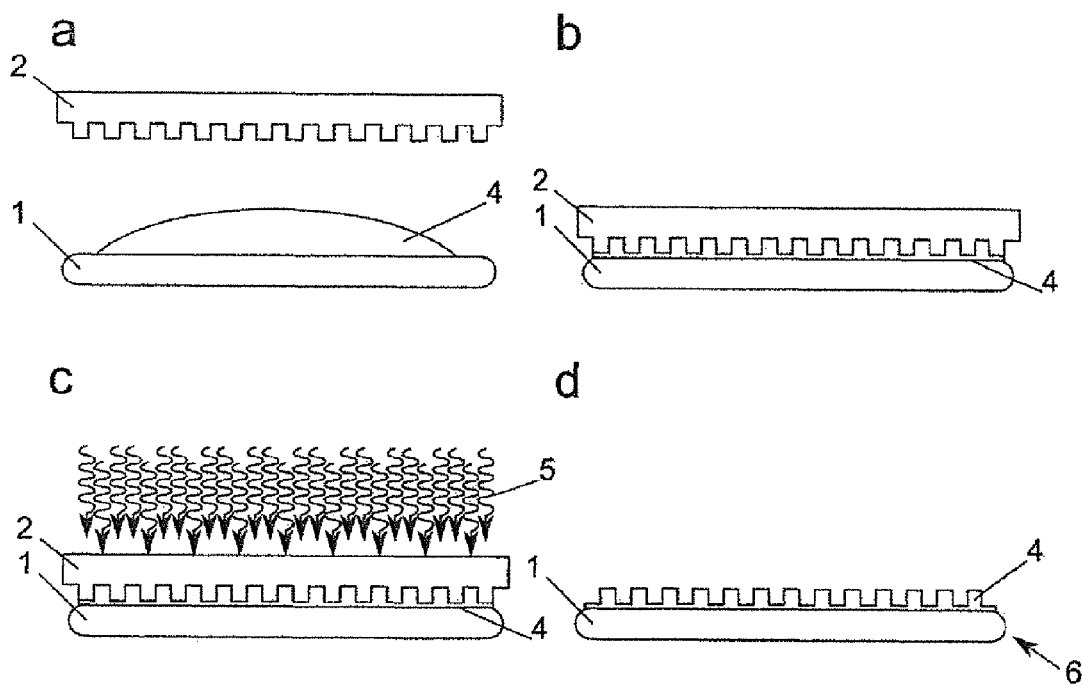
FIG. 2a shows a first step, according to the invention, of the enameling of a substrate with an embossing material.
FIG. 2b shows a second step, according to the invention, of the embossing.
FIG. 2c shows a third step, according to the invention, of the irradiation of the substrate and/or die and/or heating layer for heating.
FIG. 2d shows a fourth step, according to the invention, for demolding the embossing material.

The sequence of the process according to the invention is depicted in an embodiment in FIGS. 2a to 2b. In the step shown in FIG. 2a, the embossing material 4 is applied on the substrate 1, and the embossing die is positioned and oriented exactly relative to the substrate.

FIG. 2b shows the end of the embossing step. The embossing die 2 and the substrate 1 are to be moved oriented parallel to one another, whereby in particular wedge error compensation takes place.

While they are being brought together or after they have been brought together, the heating layer 3 (not shown in FIGS. 2a to 2d) is heated by means of microwaves 5 from a microwave-generating system, not shown, in order to heat and to harden the embossing material 4 by heat conduction.

After hardening has been completed, the embossing die 2 is demolded in a non-destructive manner from the hardened embossing material 4 by separating means, so that a negative 6 is produced.

REFERENCE SYMBOL LIST

1 Substrate
2 Die
3 Heating Layer
4 Embossing Material
5 Microwaves
6 Negative

The invention claimed is:

1. A process for embossing a structure in an embossing material that is applied on a substrate, comprised of the steps of:
  embossing the embossing material by an embossing die, and
  hardening the embossing material, by irradiating with microwaves three or more of the following:
    the substrate,
    the embossing die,
    a heating layer comprised of a molecular dipolar compound arranged between the substrate and the embossing material, and
    a heating layer comprised of a molecular dipolar compound arranged between the embossing die and the embossing material.

2. Process according to claim 1, wherein the microwaves used for irradiation are electromagnetic waves with a frequency of between 0.01 GHz and 100 GHz.

3. Process according to claim 2, wherein the microwaves used for irradiation are electromagnetic waves with a frequency of between 0.1 and 50 GHz.

4. Process according to claim 3, wherein the microwaves used for irradiation are electromagnetic waves with a frequency of between 1 and 10 GHz.

5. Process according to claim 4, wherein the microwaves used for irradiation are electromagnetic waves with a frequency of between 2 and 5 GHz.

6. Process according to claim 5, wherein the microwaves used for irradiation are electromagnetic waves with a frequency of about 2.45 GHz.

7. Process according to claim 1, further comprising the step of applying a heating layer on a surface of the substrate facing the embossing die to form the heating layer arranged between the substrate and the embossing material.

8. Process according to claim 7, wherein the heating layer applied on the surface of the substrate facing the embossing die is formed of a liquid film comprised of the molecular dipolar compound.

9. Process according to claim 8, wherein the molecular dipolar compound is deionized water.

10. Process according to claim 7, further comprising the step of applying a heating layer on a structural embossing side of the embossing die to form the heating layer arranged between the embossing die and the embossing material.

11. Process according to claim 1, wherein the substrate has a molar heating capacity of between 0.001 J/gK and 100 J/gK.

12. Process according to claim 1, wherein the substrate has a thickness of between 10,000 μm and 0.1 μm.

13. Process according to claim 1, further comprising the step of applying a heating layer on a structural embossing side of the embossing die to form the heating layer arranged between the embossing die and the embossing material.

14. Process according to claim 13, wherein the heating layer applied on the structural embossing side of the embossing die is formed of a liquid film comprised of the molecular dipolar compound.

15. Process according to claim 14, wherein the molecular dipolar compound is deionized water.

* * * * *